United States Patent [19]

Inoue et al.

[11] Patent Number: 4,695,869
[45] Date of Patent: Sep. 22, 1987

[54] GAAS SEMICONDUCTOR DEVICE

[75] Inventors: Kazuhiko Inoue, Kawasaki; Tatsuro Mitani, Tokyo; Yoshihiro Kishita, Kawasaki, all of Japan

[73] Assignee: Kabushiki Kaisha Toshiba, Kawasaki, Japan

[21] Appl. No.: 883,011

[22] Filed: Jul. 7, 1986

Related U.S. Application Data

[63] Continuation of Ser. No. 613,186, May 23, 1984, abandoned.

[30] Foreign Application Priority Data

May 31, 1983 [JP] Japan ................... 58-94859

[51] Int. Cl.$^4$ ................... H01L 23/48; H01L 23/54
[52] U.S. Cl. ................... 357/71; 357/67; 357/15
[58] Field of Search ................... 357/67, 71, 15, 16

[56] References Cited

FOREIGN PATENT DOCUMENTS

| 0110460 | 9/1978 | Japan | 357/67 |
| 0080366 | 6/1980 | Japan | 357/71 |
| 5728359 | 2/1982 | Japan | . |
| 0040858 | 3/1983 | Japan | 357/71 |

OTHER PUBLICATIONS

"Ohmic Contact Technique for N-Type GaAs, GaAsP and GaAlAs"-Rideout-IBM Disclosure Bulletin-vol. 16, No. 9, Feb. 1974, pp. 3070-3071.

Primary Examiner—Martin H. Edlow
Assistant Examiner—S. V. Clark
Attorney, Agent, or Firm—Finnegan, Henderson, Farabow, Garrett & Dunner

[57] ABSTRACT

A GaAs semiconductor device, includes a p-type GaAs substrate, an n-type region formed in the surface area of the substrate, an ohmic contact electrode formed in ohmic contact with the n$^+$-type region and having a layer of alloy of gold, and an interconnection electrode formed on the ohmic contact electrode and including an upper layer of aluminum and a lower layer of a metal which prevents gold from passing through it. The interconnection electrode is formed such that it covers the top and side surfaces of the ohmic contact electrode.

14 Claims, 8 Drawing Figures

FIG. 1A
PRIOR ART
FIG. 1B
PRIOR ART
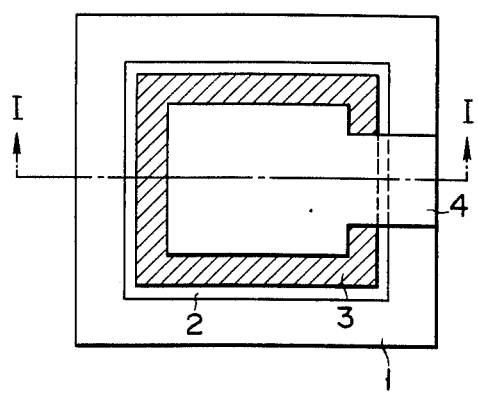
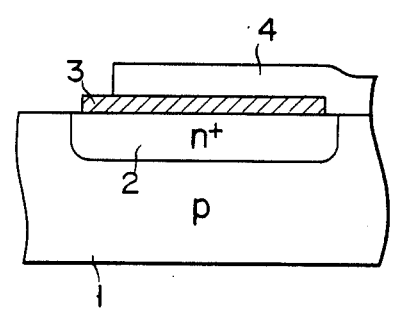
FIG. 2A
FIG. 2B
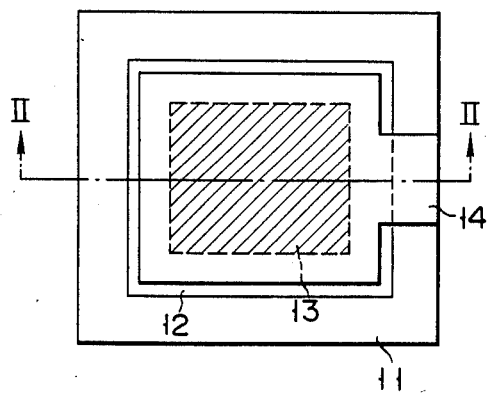
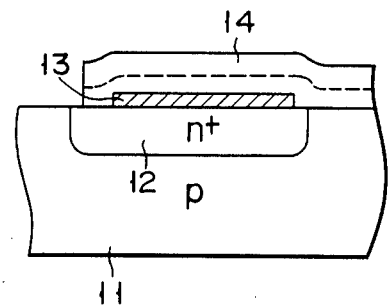

GAAS SEMICONDUCTOR DEVICE

This application is a continuation, of application Ser. No. 613,186, filed 5/23/84, now abandoned.

BACKGROUND OF THE INVENTION

This invention relates to semiconductor devices and, more particularly, to GaAs semiconductor devices with an electrode structure subject to minimum deterioration.

Planar semiconductor devices usually have a structure of a semiconductor substrate, an ohmic contact electrode formed thereon, and a second electrode formed on the first electrode or ohmic contact electrode for use as a bonding electrode or interconnection electrode. The second electrode is required to be free from the formation of intermetal compounds with the ohmic contact electrode, to be capable of being in good contact with the material to be bonded, to have low resistivity, and to have a satisfactory thermal press bonding property when it is used as a bonding electrode.

In a prior art GaAs semiconductor device, the ohmic contact electrode is made of an alloy primarily composed of gold (e.g., Au-Ge alloys and Au-Si alloys for n-type substrates and Au-Zn alloys and Au-Be alloys for p-type substrates), while the second electrode is made of aluminum or gold.

Where an n-type Ga-As substrate is used, a platinum or nickel layer is provided on the Au-Ge layer as an ohmic contact electrode in order to prevent the phenomena of ball-up in the Au-Ge layer and oxidation of Ge which would otherwise occur during a thermal treatment of wafer due to the fact that the Au-Ge layer has a low wetting property with respect to the n-type Ga-As substrate.

However, the platinum or nickel layer is formed to a very small thickness, so that gold in the adjacent Au-Ge layer will be diffusedly precipitated on the surface of this electrode layer during the thermal treatment. As mentioned earlier, the second electrode is made of either aluminum or gold. Where aluminum is used for the second electrode, it will be in direct contact with the precipitated gold, resulting in the formation of $AuAl_2$, $Au_2Al$ or a mixture of these compounds. To prevent the formation of these intermetal compounds, a titanium layer is provided as buffer layer between the second electrode and ohmic contact electrode. While the second electrode is used for either interconnection electrode or bonding pad electrode as mentioned, in the latter case gallium in the Ga-As substrate is caused to be diffused through the individual layers to be precipitated on the surface of the second electrode. Deterioration of the thermal press bonding property of the second electrode due to oxidation of gallium is prevented by.

Despite the measures mentioned above, the prior art Ga-As semiconductor device has the following problems. First, where gold is used for the second electrode, the material cost is expensive. In addition, it is very disadvantageous that available wire bonding equipment cannot be used. More specifically, in the case of equipment for manufacturing a semiconductor device with a silicon substrate, the employed wire bonder is set to conditions suited to the aluminum used. Therefore, temperature and load conditions have to be varied for each wire bonding when gold is used, so that the production efficiency is reduced. Of course, the installation of new equipment in the case where gold is used increases the manufacturing cost.

Where aluminum is used for the second electrode, there arises the following problem. FIG. 1 shows a Ga-As semiconductor diode which uses aluminum for the second electrode. The illustrated semiconductor device is obtained by forming an $n^+$-type region 2 in the surface area of a Ga-As substrate, forming an ohmic contact elecrtrode 3 on the $n^+$-type region, and forming a second electrode 4 on the ohmic contact electrode. The ohmic contact electrode 3 has a two-layered structure of a platinum layer and an Au-Ge layer, while the second electrode has a structure of an aluminum layer and a titanium layer, as mentioned before. In this laminated structure, however, the second electrode covers a smaller area than the first electrode. This means that the aluminum and titanium layers of the second electrode are exposed around the edges thereof during a process of fablicating an element. The corresponding edges of the two electrodes are spaced apart to an extent substantially equal to the thickness of the titanium layer in the second electrode. Nevertheless, Al-Au compounds will be formed in the neighborhood of the exposed edges of the second electrode due to outward diffusion of aluminum therein, which is caused by a thermal load in a thermal treatment in the element fabrication process. The Al-Au compounds thus formed will remain as seed after the completion of the Ga-As semiconductor device, and it gradually grows in the electrode. With the growth of the Al-Au compounds, the resistivity is increased to deteriorate the performance of the device.

SUMMARY OF THE INVENTION

An object of the invention is to provide a Ga-As semiconductor device with which the formation of intermetal compounds between the ohmic contact electrode and the interconnection electrode formed thereon can be satisfactorily prevented.

According to the invention, the above object is attained by a Ga-As semiconductor device, which comprises a Ga-As substrate, an ohmic contact electrode formed on the substrate and including a layer of an alloy of gold, and a conductive member formed on the ohmic contact electrode so as to cover the top and side surfaces thereof and including an upper layer of aluminum and a lower layer of a metal which prevents gold from passing therethrough.

According to the invention, the top and side surfaces of the ohmic contact electrode are covered by the lower layer of the conductive member, so that the upper layer of aluminum will never be in contact with the ohmic contact electrode. Thus, there is no possibility of intermetal compound being formed between the upper layer of the conductive member and ohmic contact layer.

BRIEF DESCRIPTION OF THE DRAWINGS

FIG. 1A is a plan view showing a prior art semiconductor diode;

FIG. 1B is a sectional view taken along line I—I in FIG. 1A;

FIG. 2A is a plan view showing an embodiment of the GaAs semiconductor diode according to the invention;

FIG. 2B is a sectional view taken along line II—II in FIG. 2B; and

DETAILED DESCRIPTION OF THE PREFERRED EMBODIMENT

Figure 3A:
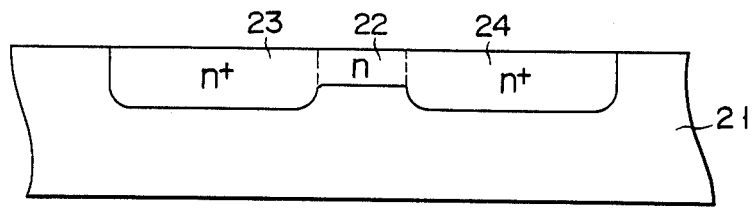
FIGS. 3A through 3D are views illustrating a manufacturing process of the GaAs semiconductor MES FET embodying the invention.

FIGS. 2A and 2B show a GaAs semiconductor device embodying the invention. The illustrated semiconductor diode includes a p-type GaAs substrate 11 with an n+-type surface region 12 formed therein, an ohmic contact electrode 13 formed to cover the n+-type region 12, and an interconnection electrode 14 formed on the ohmic contact electrode 13. The ohmic contact electrode 13, like the one shown in FIGS. 1A and 1B, has a two-layer structure of an upper layer of platinum and a lower layer of a Au-Ge alloy. Also, the interconnection electrode 14 is formed of an upper layer of aluminum and a lower layer of a metal such as titanium, molybdenum or tantalum which prevents gold from passing therethrough. As is obvious from FIGS. 2A and 2B, the interconnection electrode 14 covers the entire ohmic contact electrode 12 with its peripheral portion surrounding the side surface of the ohmic contact electrode 13.

In this semiconductor device, the top and side surfaces of the ohmic contact electrode 3 are perfectly covered by the lower layer of the interconnection electrode 14. That is, the aluminum upper layer of the interconnection electrode 14 is isolated from the ohmic contact electrode 13 by the lower layer of a metal such as titanium, molybdenum, tantalum or the like. Further, gold in the ohmic contact electrode 13 will never pass through the lower layer in the interconnection electrode 14 when the semiconductor wafer undergoes thermal treatment. Gold in the ohmic contact electrode 13 will thus never be brought into contact with the aluminum upper layer in the interconnection electrode 14, so that there is no possibility of the formation of Au-Al compounds. As has been shown, it is possible to obtain a GaAs semiconductor device which can reliably prevent the formation of Au-Al compound and ensures excellent electrical properties.

FIGS. 3A through 3D illustrate an example of the manufacturing process of a GaAs semiconductor device embodying this invention. On a semi-insulating GaAs substrate 21, as shown in FIG. 3A, a well-known process is used to form an insulating film, which is then selectively etched to form a mask having a predetermined pattern. An n-type impurity is then doped by ion implantation into the exposed surface region of the GaAs substrate 21 with the mask of a predetermined pattern thereon. Subsequently, the semiconductor structure is subjected to an annealing treatment, whereby an n-type region 22 and n+-type regions 23 and 24 adjacent to the opposite sides of the n-type region 22 are formed in the substrate, as shown in FIG. 3A. For the formation of the n-type region, the ion implantation is carried out with the dose set to $3 \times 10^{12}$ cm$^{-2}$ and implantation energy set to 100 keV, for instance. For the formation of the n+-type regions 23 and 24, the ion implantation is carried out with the dose set to $3 \times 10^{13}$ cm$^{-2}$ and implantation energy set to 200 keV.

Figure 3B:
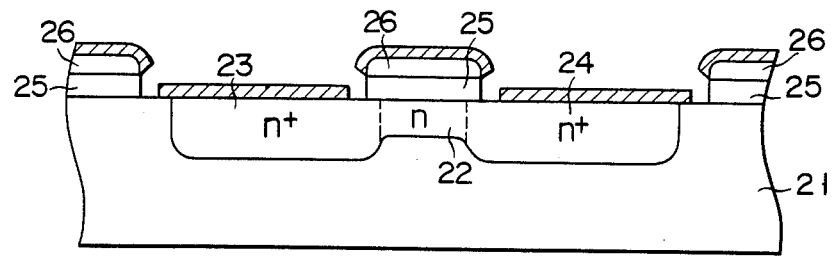
Figure 3C:
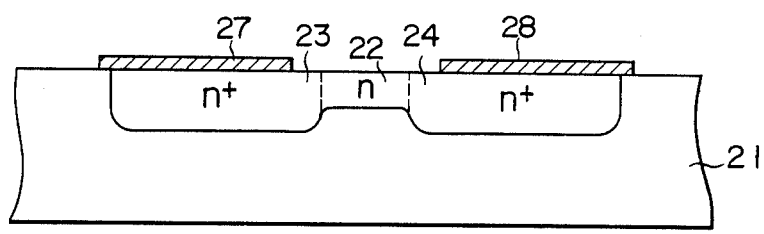

Subsequently, a SiO$_2$ film 25 is formed by a CVD process using silane on the surface of the substrate 21 to a thickness of approximately 5,000 Å. Then a resist film 26 for a resist pattern is formed on the SiO$_2$ film 25, and then the portion of the films 25 and 26 over the n+-type regions 23 and 24 is removed, whereby the SiO$_2$ film 25 and the resist film 26 are selectively formed on the n-type region 22 and the other surface portion of the substrate 21 not including the n-type regions 23 and 24, as shown in FIG. 3B. Then, an Au-Ge alloy layer with a thickness of 2,000 Å and a platinum layer with a thickness of 300 Å are formed in the mentioned order by means of a deposition process on the entire surface of the substrate structure. Afterwards, the resist film 26 is melted away using an organic solvent, e.g., aceton, thus removing portions of the Au-Ge alloy layer and platinum layer on the resist film 26 together with the film 26. The Au-Ge alloy layer and platinum layer are thus left over the n+-type regions 23 and 24. These Au-Ge alloy and platinum layers are subsequently thermally treated, whereby source and drain electrodes 27 and 28, formed of the respective Au-Ge alloy and platinum layers, are formed in ohmic contact with the respective n+-type regions 23 and 24, as shown in FIG. 3C. During the thermal treatment, alloying proceeds in the neighborhood of the interface between the Au-Ge alloy layer and platinum layer, while gold is precipitated on the surfaces of the source and drain electrodes 27 and 28.

Thereafter, the SiO$_2$ film 25 is removed using, for instance, an ammonium fluoride liquid. Then, an SiO$_2$ film is formed atop the semiconductor structure to a thickness of approximately 10,000 Å, and a resist film is formed on the SiO$_2$ film. Portions of the resist film over the regions 23 and 24 are then removed, and the SiO$_2$ film is then selectively removed with the resist pattern thus formed as a mask. The resist pattern is formed such that the inner wall of its opening is spaced apart at least 4$\mu$ from the corresponding edges of the exposed source and drain electrodes 27 and 28.

Subsequently, a titanium layer with a thickness of 3,000 Å and then an aluminum layer with a thickness of 10,000 Å are formed in the mentioned order by a vacuum deposition process on the semiconductor wafer. Then, a resist pattern is formed on the aluminum film, and the aluminum layer and titanium layer are selectively removed with the resist pattern as a mask, whereby bonding pad electrodes or interconnection electrodes 29 and 30 are formed on the respective source and drain electrodes 27 and 28, and a gate electrode 31 is formed on the n-type region 22 between the electrodes 29 and 30, as shown in FIG. 3D.

Figure 3D:
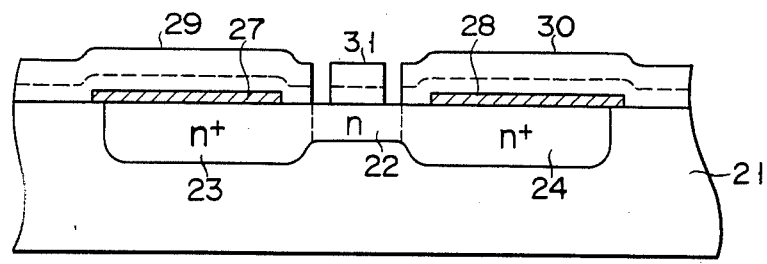

In the semiconductor device of FIG. 3D thus obtained, the lower layer, which is 3,000 Å in thickness, of the lead electrodes 29 and 30 completely covers the top and side surfaces of the source and drain electrodes 27 and 28, which are 2,300 Å in thickness. Thus, although gold is precipitated on the surface of the source and drain electrodes 27 and 28, it is isolated from the aluminum layer of the interconnection electrodes 29 and 30 by the titanium layer, so that there is no possibility of the formation of intermetal compounds between the source and drain electrodes and aluminum layer. Of course the side surfaces of the electrodes 27 and 28 are covered by the titanium layer, so that gold or platinum contained in the interconnection electrodes 29 and 30 is never in contact with the aluminum layer of the interconnection electrodes 29 and 30, and hence undesired intermetal compound will never be formed.

Besides, since bonding pad electrodes or lead electrodes in the semiconductor device shown in FIG. 3D are made of aluminum, the conventional equipment for manufacturing silicon semiconductor devices can be used, so that this type of GaAs semiconductor device can be manufactured comparatively inexpensively.

While preferred embodiments of the invention have been described above, it is by no means limited only to these embodiments. For example, the laminated structure, formed of the Au-Ge alloy layer and platinum layer formed as the ohmic contact layer in the embodiment shown in FIGS. 3A through 3D, may be replaced with a laminated structure formed of an Au-Ge alloy layer and a nickel layer or a laminated structure formed of a gold layer, platinum layer, and a titanium layer.

Further, the invention may be applied not only to MES FET semiconductor devices but also to semiconductor devices which have ohmic contact electrodes in ohmic contact with various other semiconductor elements, such as a diode.

What is claimed is:

1. A GaAs semiconductor device comprising:
   a GaAs substrate;
   a plurality of ohmic contact electrodes formed on said substrate and each including a layer of alloy of gold; and
   a plurality of conductive members respectively formed on said ohmic contact electrodes and each including an upper layer of aluminum and a lower layer of a metal capable of preventing gold from passing therethrough, said lower layer being formed to cover completely the top and side surfaces of a corresponding one of said ohmic contact electrodes.

2. A GaAs semiconductor device according to claim 1, further comprising a semiconductor region of the opposite conductivity type formed in the surface area of said semiconductor substrate and said ohmic contact electrodes are formed in ohmic contact with said semiconductor region.

3. A GaAs semiconductor device according to claim 2, wherein said lower layer of said conductive members has a greater thickness than that of said ohmic contact electrode.

4. A GaAs semiconductor device according to claim 3, wherein said lower layer of said conductive members is made of a metal selected from a group consisting of titanium, molybdenum, and tantalum.

5. A GaAs semiconductor device according to claim 4, wherein each said ohmic contact electrode includes an upper layer of platinum and a lower layer of Au-Ge alloy.

6. A GaAs semiconductor device according to claim 3, wherein each said ohmic contact electrode includes an upper layer of platinum and a lower layer of Au-Ge alloy.

7. A GaAs semiconductor device according to claim 1, wherein said lower layer of said conductive members has a greater thickness than that of said ohmic contact electrode.

8. A GaAs semiconductor layer device according to claim 7, wherein said lower layer of said conductive members is made of a metal selected from a group consisting of titanium, molybdenum, and tantalum.

9. A GaAs semiconductor device according to claim 8, wherein each said ohmic contact electrode includes an upper layer of platinum and a lower layer of Au-Ge alloy.

10. A GaAs semiconductor device according to claim 1, wherein a semiconductor region is formed in the surface area of said semiconductor substrate and said ohmic contact electrode is disposed on said semiconductor substrate and semiconductor region, and formed in ohmic contact with said semiconductor region.

11. A GaAs semiconductor device comprising:
    a GaAs substrate;
    $n^+$-source and drain regions formed in the surface area of said GaAs substrate;
    a channel region formed between said $n^+$-type source and drain regions in the surface area of said GaAs substrate;
    a gate structure formed on said channel region;
    first and second ohmic contact electrodes respectively formed in ohmic contact with said $n^+$-type source and drain regions, and each including a layer of alloy of gold;
    first and second conductive members respectively formed on said first and second ohmic contact electrodes without touching said channel region and each including an upper layer of aluminum and a lower layer of metal capable of preventing gold from passing therethrough, said lower layer being formed to cover completely the top and side surfaces of a corresponding one of said first and second ohmic contact electrodes.

12. A GaAs semiconductor device according to claim 11, wherein said lower layer of each of said first and second conductive members has a greater thickness than that of said first and second ohmic contact electrodes.

13. A GaAs semiconductor device according to claim 12, wherein said lower layer of each said first and second conductive members is made of a metal selected from a group consisting of titanium, molybdenum, and tantalum.

14. A GaSa semiconductor device according to claim 13, wherein each of said first and second ohmic contact electrodes includes an upper layer of platinum and a lower layer of Au-Ge alloy.

* * * * *